United States Patent
Moslehi et al.

(10) Patent No.: US 6,705,394 B1
(45) Date of Patent: Mar. 16, 2004

(54) RAPID CYCLE CHUCK FOR LOW-PRESSURE PROCESSING

(75) Inventors: Mehrdad M. Moslehi, Los Altos, CA (US); Xiangqun Chen, Plano, TX (US); Shiyuan Cheng, Richardson, TX (US); Cecil J. Davis, Greenville, TX (US)

(73) Assignee: CVC Products, Inc., Rochester, NY (US)

( * ) Notice: Subject to any disclaimer, the term of this patent is extended or adjusted under 35 U.S.C. 154(b) by 0 days.

(21) Appl. No.: 09/664,011

(22) Filed: Sep. 19, 2000

Related U.S. Application Data

(60) Provisional application No. 60/162,469, filed on Oct. 29, 1999.

(51) Int. Cl.⁷ ................................................ C23C 16/02
(52) U.S. Cl. ...................... 165/206; 165/48.1; 165/80.2; 118/724; 118/725
(58) Field of Search ................................ 165/80.1, 206, 165/47, 48.1, 80.2; 118/715, 724, 725, 728; 156/345.51, 345.53; 219/385; 269/903; 427/557; 438/795, 796; 451/53

(56) References Cited

U.S. PATENT DOCUMENTS

| | | | | |
|---|---|---|---|---|
| 4,567,938 A | * | 2/1986 | Turner | 165/80.1 X |
| 4,680,061 A | | 7/1987 | Lamont, Jr. | 250/398 |
| 4,949,783 A | | 8/1990 | Lakios et al. | 165/80.1 |
| 4,971,653 A | | 11/1990 | Powell et al. | |
| 5,177,878 A | | 1/1993 | Visser | 34/92 |
| 5,192,849 A | | 3/1993 | Moslehi | 219/121.43 |
| 5,294,778 A | | 3/1994 | Carman et al. | 219/385 |
| 5,320,982 A | | 6/1994 | Tsubone et al. | 438/714 |
| 5,382,311 A | | 1/1995 | Ishikawa et al. | 156/345.54 |
| 5,421,894 A | * | 6/1995 | Lei et al. | 118/725 |
| 5,566,744 A | * | 10/1996 | Tepman | 165/80.1 |
| 5,567,267 A | | 10/1996 | Kazama et al. | 156/345.27 |
| 5,730,803 A | * | 3/1998 | Steger et al. | 118/724 X |
| 5,736,106 A | * | 4/1998 | Ishiguro et al. | |
| 5,775,416 A | | 7/1998 | Heimanson et al. | 165/275 |
| 5,863,843 A | * | 1/1999 | Green et al. | 118/724 X |
| 6,120,608 A | * | 9/2000 | Shendon et al. | 118/728 |
| 6,313,441 B1 | * | 11/2001 | Schaper et al. | 118/724 X |
| 6,319,569 B1 | * | 11/2001 | Callaway et al. | 118/724 X |
| 6,375,746 B1 | * | 4/2002 | Stevens et al. | 118/724 |
| 6,394,797 B1 | * | 5/2002 | Sugaya et al. | 118/724 |
| 6,406,545 B2 | * | 6/2002 | Shoda et al. | 118/724 |

FOREIGN PATENT DOCUMENTS

WO     WO 97/19303     5/1997

\* cited by examiner

Primary Examiner—Ljiljana Ciric
(74) Attorney, Agent, or Firm—Brian B. Shaw, Esq.; Thomas B. Ryan; Harter, Secrest & Emery LLP

(57) ABSTRACT

Rapid thermal cycling of substrates in low-pressure processing environments is achieved by movable temperature conditioners located outside the processing environments. The substrates are mounted on thermally conductive pedestals for processing in the low-pressure environment. The temperature conditioners are movable both into and out of thermal contact with the pedestals outside the low-pressure environment to regulate transfers of heat through the pedestals between the substrates and the temperature conditioners. A translatable cooler block with a high thermal mass and a large interface area with the pedestal can be used as a temperature conditioner for more rapidly withdrawing heat from the substrate.

63 Claims, 3 Drawing Sheets

RAPID CYCLE CHUCK FOR LOW-PRESSURE PROCESSING

This application claims the benefit of U.S. Provisional Application No. 60/162,469, filed on Oct. 29, 1999 now abandoned which Provisional application is incorporated by reference herein.

TECHNICAL FIELD

Active heating and cooling of substrates in low-pressure processing environments involve transferring heat to and from the substrates through thermally conductive chucks. Operations performed on the substrates include physical vapor deposition (PVD), chemical vapor deposition (CVD), ion beam sputtering, annealing, and cleaning.

BACKGROUND

Many low-pressure substrate processing operations are best performed at controlled substrate temperatures. During operations involving thermal depositions (e.g., CVD and annealing), elevated temperatures accomplish much of the processing. Other operations, including some plasma-assisted operations (e.g., PVD), benefit from maintaining constant substrate temperatures or substrate temperatures that are adjusted throughout different stages of the operations.

Thermally conductive chucks support substrates, such as silicon wafers, for such low-pressure processing within vacuum processing chambers. The substrates are held in place upon the chuck by gravity or fixed more securely in place using mechanical or electrostatic clamps. Although some radiational heating or cooling can take place within the vacuum processing chambers, substrate temperatures are mainly regulated through an interface between the substrates and the thermally conductive chucks. An inert gas, such as argon, is circulated through or confined within the otherwise low-pressure interface to assist transfers of heat between the substrates and their supporting chucks.

Most such chucks are arranged for either heating or cooling the substrates. U.S. Pat. No. 4,680,061 to Lamont Jr. discloses examples of both. One of the Lamont Jr.'s chucks has a ceramic heating element mounted in a cavity of the chuck's body next to a substrate. Another of Lamont Jr.'s chucks has coolant channels for withdrawing heat from a chuck body portion next to a substrate. Such one-way temperature controls lack the flexibility to regulate temperature fluctuations in opposite directions and slow processing times when different directions of heat transfer between substrates and chucks are needed.

Co-assigned U.S. Pat. No. 5,775,416 to Heimanson et al. discloses a temperature controlled chuck incorporating both heating and cooling units. Both units are embedded in the chuck body—the heating unit next to the substrate and the cooling unit next to the heating unit. An evacuatable cavity separates the heating and cooling units. Pressure in the cavity is controlled to regulate the rate of heat transfer from the heating unit to the cooling unit.

The Heimanson et al. chuck provides for more accurately controlling substrate temperatures and for shortening processing times. Predetermined substrate temperatures can be achieved, maintained, or changed in an orderly manner despite processing interactions, which can transfer thermal energy into the substrate. More rapid cool-downs following operations that take place at higher temperatures are also possible.

Despite the improved processing made possible by the Heimanson et al. chuck, cycling speeds between periods of thermal isolation and thermal communication between heating and cooling units are subject to the gas flow rates into and out of the cavity separating the two units. Substantial gas pressure is required to optimize heat transfers, and gas pressure approaching a vacuum is required to most effectively inhibit heat transfers.

SUMMARY OF THE INVENTION

This invention achieves more rapid cycling among or between substrate heating and cooling operations by providing a chuck with a relatively movable temperature conditioner. The chuck preferably has a pedestal in thermal communication with a substrate. The temperature conditioner, which can be a heating unit or preferably a cooling unit, is movable into and out of thermal contact with the pedestal. The movement of the temperature conditioner into and out of thermal contact with the pedestal provides for more rapidly changing substrate temperature, which improves processing control and shortens processing time.

One example of such a rapid thermal-cycle chuck includes a thermally conductive pedestal that supports a substrate for processing in the low-pressure processing environment. A temperature conditioner, which is located outside the low-pressure processing environment, is mounted for relative movement with respect to the thermally conductive pedestal. An actuator relatively moves the temperature conditioner with respect to the thermally conductive pedestal between a first position in enhanced thermal contact with the thermally conductive pedestal and a second position in reduced thermal contact with the thermally conductive pedestal. The two positions regulate rates of heat transfer between the temperature conditioner and the pedestal.

The temperature conditioner preferably includes a thermally conductive block having a substantial thermal mass along with a substantial interface area for contacting the pedestal, which at the second position can acquire a considerable temperature difference from the pedestal. When moved into thermal contact with the pedestal, the considerable temperature difference together with the substantial thermal mass and interface area supports a rapid transfer of heat between the temperature conditioner and the pedestal. Atmospheric pressure preferably prevails at the interface between the temperature conditioner and the pedestal to support the heat transfers.

A cooling unit within the temperature conditioner can provide active cooling of the substrate. Conduits circulate coolant through a thermally conductive block to withdraw heat, which can be discharged beyond the chuck. A heating unit within the pedestal can provide active heating of the substrate. One or more heating coils are embedded in a thermally conductive block of the pedestal. Rapid heating of the substrate preferably takes place with the heating unit activated and with the cooling unit of the temperature conditioner, which can also be activated, out of effective thermal contact with the pedestal. Rapid cooling of the substrate preferably takes place with the heating unit deactivated and with the cooling unit both activated and in effective thermal contact with the pedestal.

The actuator, which can take a variety of forms transforming fluid or electrical power into mechanical motion, preferably translates the temperature conditioner along an axis between the first and second positions. At the first position, the temperature conditioner is preferably in direct contact with the pedestal. At the second position, the temperature conditioner is preferably at a fixed distance from the pedestal sufficient to interrupt effective heat transfers between the temperature conditioner and the pedestal. A distance of no more than two millimeters is generally sufficient for this purpose. Fixed stops can be used to hold this distance.

A low-pressure processing system incorporating such a chuck includes an evacuatable chamber for processing a substrate within a low-pressure processing environment. The chuck has a pedestal that supports the substrate for processing within the low-pressure processing environment. A relatively movable temperature conditioner is located outside the low-pressure processing environment. An actuator relatively moves the temperature conditioner with respect to the pedestal for regulating heat transfers between the substrate and the temperature conditioner.

An interface between the temperature conditioner block and the pedestal is preferably exposed to pressure conditions (preferably atmospheric pressure) outside the evacuatable chamber. While in contact, gas molecules fill the interface and support efficient transfers of heat between the temperature conditioner block and the pedestal—effectively increasing the area of conductive contact between the two bodies. However, at a small separation between the temperature conditioner block and the pedestal of approximately one millimeter or more, the efficiency of heat transfer significantly decreases—effectively isolating the two bodies.

The temperature conditioner is preferably a cooler block made of a thermally conductive material with an effective interface area with the pedestal sized for removing heat from the pedestal at a rate of at least 50 degrees centigrade per minute. Although choices of material and mass can provide some thermal capacity for absorbing transfers of heat, active cooling of the cooler block is preferred for extending the cooler block's capacity to absorb heat. Circulation of coolant to and from the cooler block is preferred for actively removing heat from the block.

Cooling a substrate with such a low-pressure processing system involves locating the cooler block outside the low-pressure processing environment and relatively moving the cooler block into engagement with the pedestal supporting the substrate for processing within the low-pressure processing environment. The substrate together with the pedestal is cooled by transfers of heat to the cooler block. When sufficient heat has been transferred, the cooler block is relatively moved again to disengage from the pedestal. A minimal fixed separation between the disengaged cooler block and pedestal is preferably maintained to limit the amount of travel required to re-engage the cooler block and pedestal when more cooling is needed.

Cycles of heating and cooling of substrates can be carried out by locating both a heater and a cooler within the chuck of the low-pressure processing system. The heater is preferably located in direct thermal contact with the thermally conductive pedestal, and the cooler is preferably mounted outside the low-pressure processing environment for relative movement with respect to the pedestal. Activating the heater transfers heat to the pedestal for raising the substrate temperature. Relatively moving the cooler into engagement with the pedestal transfers heat from the pedestal for at least limiting the rise in substrate temperature. The heater can be deactivated upon engagement of the cooler for lowering the substrate temperature.

While the cooler is preferably relatively movable with respect to the pedestal, a heater could be similarly arranged for such relative motion to regulate the efficiency of heat transfers from the heater to the pedestal. In such a case, the cooler could be mounted in direct contact with the pedestal or remain a relatively movable component along with the heater.

Both the heater block and the cooler block can be divided into different zones to better control radial temperature gradients of the substrate. The different zones of the cooler block can be independently moved into contact with different portions of the pedestal, including the different zones of the heater.

DRAWINGS

DETAILED DESCRIPTION

Figure 1:
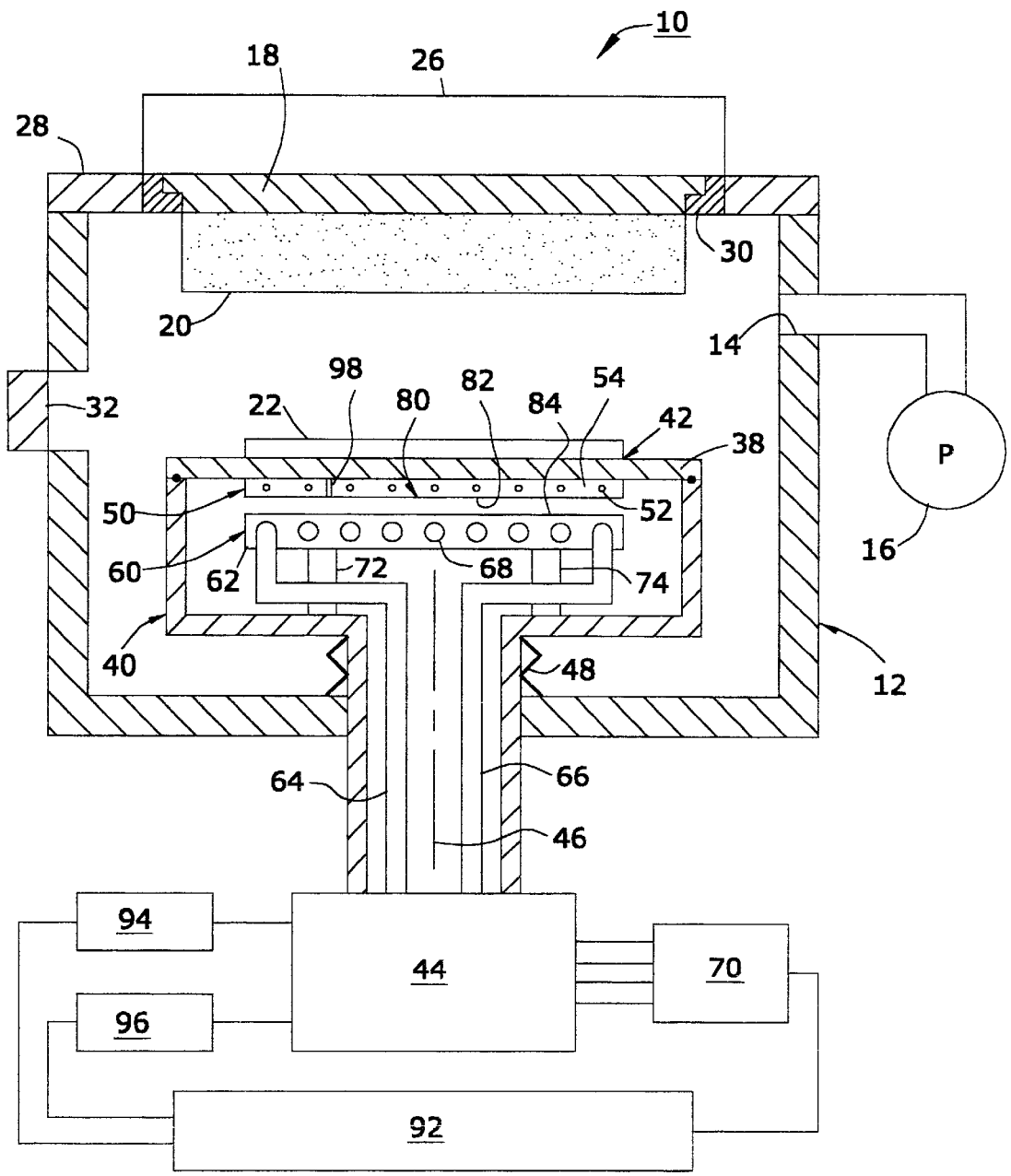
FIG. 1 is a cross-sectional schematic view of a low-pressure processing chamber with a rapid-cycle chuck having a fixed heating unit and a relatively movable cooling unit.

An exemplary plasma sputtering apparatus 10 as one example of a low-pressure processing system is shown in FIG. 1. Conventional features of such apparatus include a low-pressure (i.e., evacuatable) processing chamber 12 having an outlet port 14 connected to a vacuum pump 16 for evacuating air and plasma gasses from the chamber 12.

An electrode or backing plate 18 supports a target 20 composed of material intended for deposition onto a substrate 22. A magnetron 26 provides electrical energy and regulates erosion of the target 20 during sputtering operations. The magnetron 26 can be a DC magnetron or RF magnetron PVD energy source. A non-magnetron energy source such as an RD diode could also be used. The backing plate 18 receives the electrical power for target sputtering and is electronically isolated from a vacuum lid 28 by an insulating ring 30. An access valve 32 provides a resealable opening for moving the substrate 22 into and out of the chamber 12 (e.g., using a cluster tool central wafer handler.)

The substrate 22 is mounted on a pedestal 38 of a chuck assembly 40. The pedestal 38 is made of a thermally conductive material such as copper, titanium, niobium, or a nickel alloy (such as KOVAR, a trademark of Carpenter Technology Corporation based in Wyomissing, Pa., for an iron-nickel-cobalt alloy with a coefficient of thermal expansion similar to hard borosilicate glass) for enhancing transfers of heat to and from the substrate. Such heat exchanges can be facilitated by a heat-transfer gas that is confined within or circulated through an interface 42 between the pedestal 38 and the substrate 22. Examples of chuck assemblies with gas-filled interfaces supporting heat exchanges with substrates are disclosed in commonly assigned U.S. patent application Ser. No. 08/938,293, filed Sep. 12, 1997 entitled "Two-Stage Sealing System for Thermally Conductive Chuck", and U.S. patent application Ser. No. 08/975,626, filed Nov. 21, 1997, entitled "Thermally Conductive Chuck for Vacuum Processor", which are both hereby incorporated by reference.

A drive mechanism 44 provides for translating the chuck assembly 40 along an axis 46 toward or away from the target 20 in order to control the substrate-to-target spacing. Bellows 48 seal the chuck assembly 40 to the processing chamber 12 to accommodate a range of chuck assembly translation heights and to isolate the atmospheric components of the chuck assembly 40, including a heater 50 and a cooler 60, from the low-pressure processing space of the processing chamber 12. The chuck assembly 40 can also provide a capability for electrical biasing such as RF biasing of the substrate 22.

The heater 50 can be embedded in but is preferably attached to the pedestal 38 as depicted in FIG. 1. A heating element 52 of the heater 50 can be made of an iron-aluminum-chromium alloy (such as KANTHAL, a trademark of Kanthal AB, Sweden, for a resistance heating alloy) for heating substrates up to one thousand degrees centigrade. A heater block 54, if separate from the pedestal 38, is preferably made of a thermally conductive material such as copper or aluminum. Activation of the heater 50 raises the temperature of the pedestal 38 and (through the interface 42) also raises the temperature of the substrate 22.

The cooler 60 includes a block 62 also made of a thermally conductive material such as aluminum or copper. Conduits 64 and 66 carry a coolant, such as water, to and from the block 62; and conduits 68 circulate the coolant throughout the block 62. A chiller 70 or other heat-extracting device removes excess heat from the coolant and expels it to the surrounding environment.

Actuators 72 and 74 are two of what could be more or less actuators for translating the cooler 60 along the axis 46. Preferably, the actuators 72 and 74 are pneumatic cylinders, but other forms of fluid power or electrical power (e.g., solenoids) could also be used to produce the required mechanical motion. The cooler 60 is translatable along the axis 46 between two positions—a first position in thermal contact with the pedestal 38 and a second position out of thermal contact with the pedestal 38.

Figure 2A:
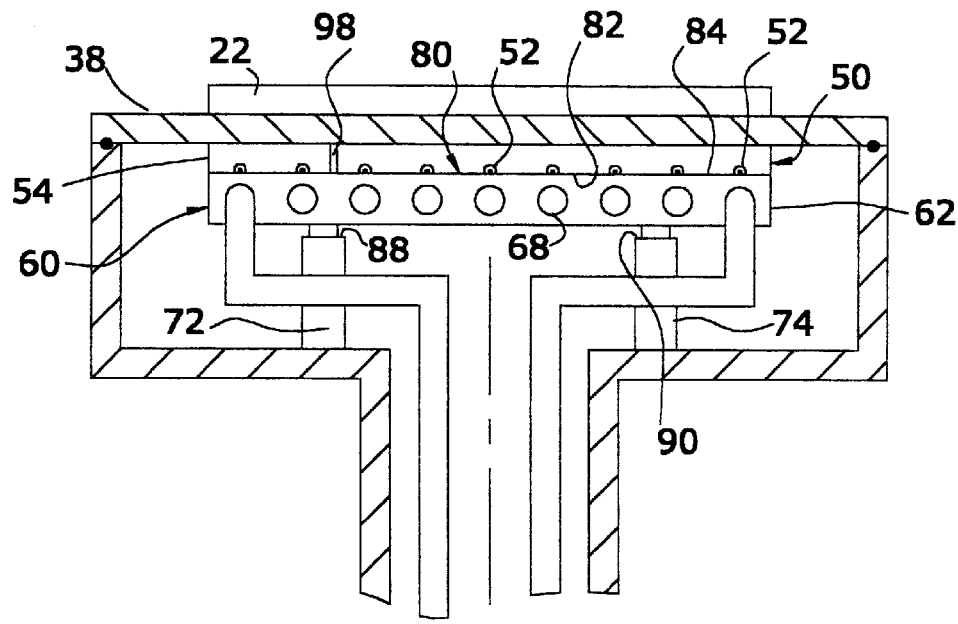
FIG. 2A is an enlarged cross-sectional view of the rapid cycle chuck in which the cooling unit is moved into thermal contact with the heating unit.
Figure 2B:
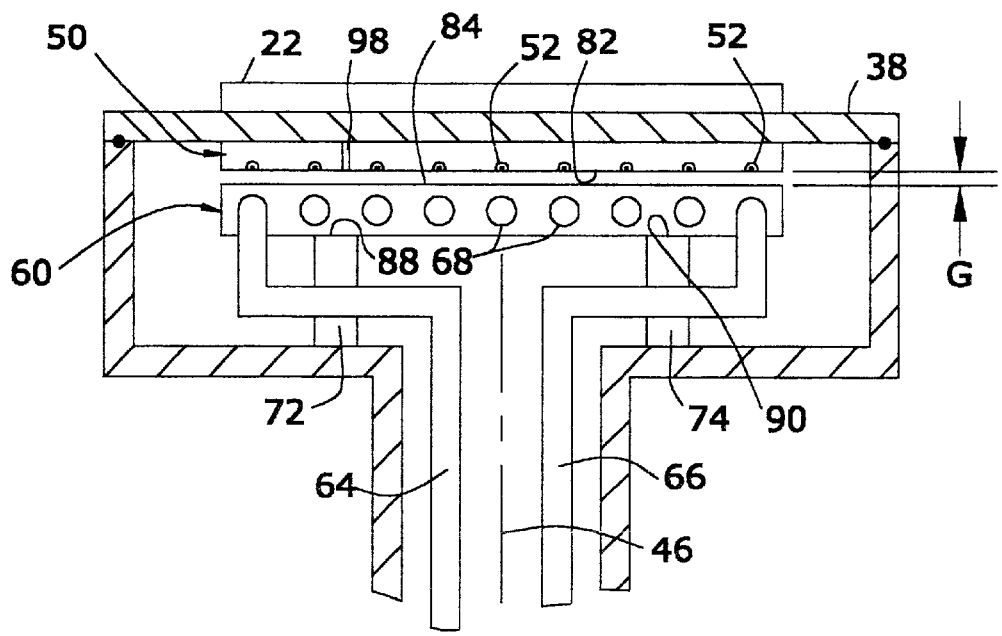
FIG. 2B is an enlarged cross-sectional view of the rapid cycle chuck in which the cooling unit is moved out of thermal contact with the heating unit.

The two positions are contrasted by FIGS. 2A and 2B. The first position, as shown in FIG. 2A, has the cooler 60 moved (e.g., translated) into direct physical contact with the heater 50. An interface 80 is defined between a lower surface 82 of the heater block 54 and an upper surface 84 of the cooler block 62 having an overlapping area that is sized to support heat transfers reducing the temperature of the pedestal 38 at a rate of at least fifty degrees centigrade per minute and preferably at least 100 hundred degrees centigrade per minute. Atmospheric pressure conditions, which preferably prevail at the interface 80, also support heat transfers by increasing the effective area of contact between the heater block 54 and the cooler block 62. The effective area of the interface 80 can also be increased by forming the lower surface 82 and the upper surface 84 with complementary irregularities or by conforming one of the surfaces 82 or 84 to the other. For example, the upper surface 84 of the cooler block 62 could be formed as a membrane covering a coolant-filled cavity.

For purposes of this discussion, the heater block 54 can be considered as a part of the pedestal 38, and contact with the heater block 54 can be considered as contact with the pedestal 38. Other intervening structures can also be used and, if similarly thermally conductive, can also be considered as a part of the pedestal 38.

The second position, as shown in FIGS. 1 and 2B, has the cooler 60 moved (e.g., translated) substantially out of thermal contact with the pedestal 38. Stops 88 and 90 formed atop the actuators 72 and 74 limit movement of the cooler 60 away from the pedestal 38. A gap "G" of only approximately two millimeters between the lower surface 82 of the heater 50 and the upper surface 84 of the cooler 60 is all the separation required to interrupt heat transfers from the pedestal 38 to the cooler 60. Preferably, this gap is only approximately one millimeter to minimize the time required to move the cooler 60 into and out of engagement with the pedestal 38.

A spring (not shown) or other biasing means (including gravity) can be used to urge the cooler 60 into either of the two positions as a default condition, and the actuators 72 and 74 can exert forces that overcome the bias to move the cooler 60 into the opposite position. The actuators 72 and 74 can also operate bi-directionally to alternately urge the cooler into both positions. Proportional or other forms of positional control can also be used to regulate thermal conductivity between the cooler 60 and the pedestal 38 as a function of the distance or area of contact between them.

A controller 92 controls operation of the chiller 70, a heater driver 94, and an actuator driver 96 to regulate temperature of the substrate 22. The heater driver 94 powers the heater 50. Thermocouples 98 provide temperature feedback to the controller 92 for regulating the amount of heat generated by the heater 50. The chiller 70 removes heat conveyed by coolant from cooler 60. Thermocouples (not shown) can also be used to provide feedback regarding the temperature of the cooler 60. Both the rate of coolant flow through the cooler 60 and the rate of heat exchange through the chiller 70 can be varied to adjust the temperature of the cooler 60. The actuator driver 96, which preferably includes a fluid power source, adjusts the cooler's proximity to the pedestal 38 for regulating transfers of heat from the pedestal 38 to the cooler 60.

An exemplary low-pressure processing operation in accordance with the invention involves mounting the substrate 22 on the pedestal 38 for processing in a low-pressure processing environment and locating the cooler 60 outside the low-pressure processing environment. The cooler 60 is relatively moved into engagement with the pedestal 38 for cooling the pedestal 38 along with the substrate 22. When sufficient heat has been removed from the substrate 22, the cooler 60 is relatively moved into disengagement from the pedestal 38. The predetermined gap "G" between the pedestal 38 and the cooler 60 is maintained during the period of disengagement to impair transfers of heat from the pedestal 38 to the cooler 60. However, the gap "G" is preferably kept at a minimum (e.g., less than 2 mm) to minimize the travel distance required to re-engage the cooler 60 with the pedestal 38. The interface 80 between the cooler 60 and the pedestal 38 is exposed to atmospheric pressure to enhance thermal conduction following the engagement or re-engagement of the cooler 60 and the pedestal 38.

Rapid heating and cooling of the substrate 22 in a low-pressure processing environment also involve positioning the substrate 22 on the thermally conductive pedestal 38 for processing within the low-pressure processing environment. The heater 50 is located in thermal contact with the thermally conductive pedestal 38. Activating the heater 50 transfers heat from the heater 50 to the pedestal 38 for raising substrate temperature. The cooler 60 is located outside the low-pressure processing environment. Relatively moving the cooler 60 into engagement with the pedestal 38 outside the low-pressure processing environment transfers heat from the pedestal 38 to the cooler 60 for at least limiting the rise in substrate temperature.

The heater 50 can be deactivated upon the engagement of the cooler 60 to provide for rapidly withdrawing heat from the substrate 22, or the engaged cooler 60 can be used to moderate the heating effects of the activated heater 50. The cooler 60 can be activated, such as by circulation of coolant, prior to its engagement with the pedestal 38 to provide an initial temperature contrast that enhances the rate of heat transfer to the cooler 60. Further control can also be exerted over cooler temperature during periods of engagement to adjust or maintain substrate temperature. The gap "G" between the cooler and the pedestal 38 can be adjusted for similar purposes.

Figure 3:
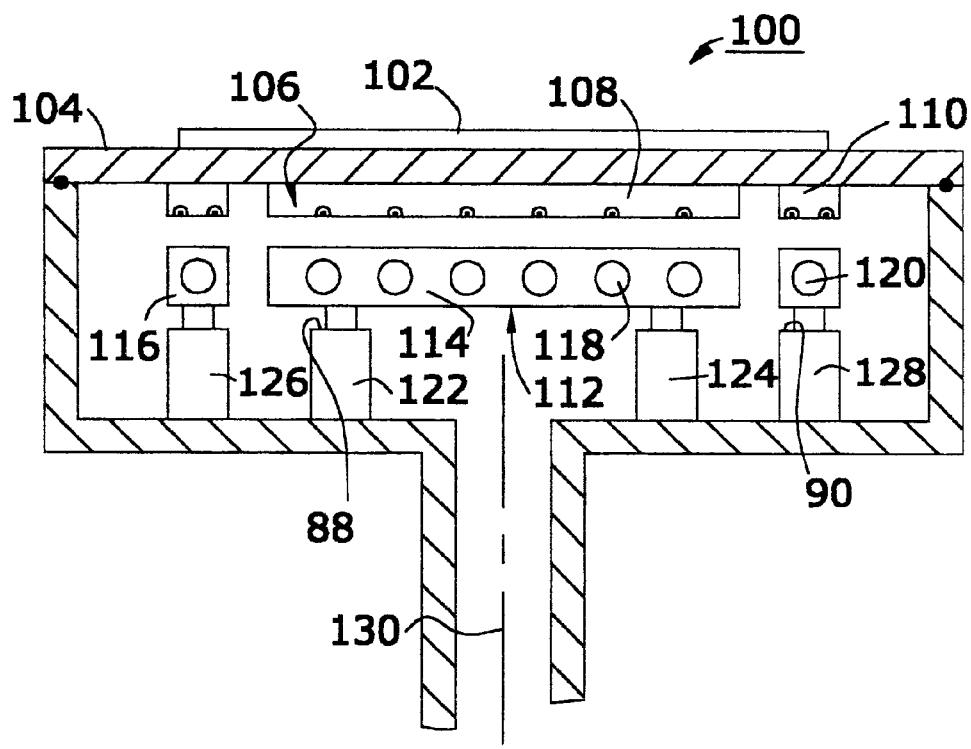
FIG. 3 is a cross-sectional view of an alternative rapid cycle chuck in which both heating and cooling units are divided into separately controlled zones.

An alternative rapid cycle chuck 100 for regulating the temperature of a substrate 102 is shown in FIG. 3. Mounted together with a thermally conductive pedestal 104 for supporting the substrate 102 is a multi-zone heater 106 having an inner zone 108 and an outer zone 110. Either a space, as shown, or a thermal insulator can be used to thermally separate the concentric zones 108 and 110 of the heater 106. Radial temperature gradients can be supported in the pedestal 104 by separately adjusting power to the two zones 108 and 110. Thermal insulators can be formed in the pedestal 104 to augment this effect.

Aligned with the concentric heater zones 108 and 110 are inner and outer cooler zones 114 and 116 of a multi-zone cooler 112. Conduits 118 and 120 convey coolant through the two cooler zones 114 and 116, which each take a block form. For simplifying the drawing, conduits that convey the coolant to and from the cooler zones (i.e., blocks) 114 and 116 are not shown. Coolant flow rates or temperatures can be separately regulated between the two cooler zones 114 and 116, or a common flow of coolant can be circulated through both cooler zones 114 and 116.

More importantly, separate groups of actuators 122, 124 and 126, 128 provide for independently translating the cooler zones 114 and 116 along a common axis 130. For example, the actuators 122 and 124 can be used to translate the inner cooler zone 114 into thermal engagement with the inner heating zone 108 while the actuators 126 and 128 maintain the outer cooler zone 116 out of thermal engagement with the outer heating zone 110 to differentially withdraw heat from a center portion of the substrate 102. Alternatively, both cooler zones 114 and 116 can be engaged or disengaged with the heater zones 108 and 110 simultaneously, or just the outer cooler zone 116 can be engaged with the outer heater zone 108 to differentially withdraw heat from a peripheral portion of the substrate 102.

More or less of the heater zones 108 and 110 and the cooler zones 114 and 116 can be aligned with each other or overlapped by unequal numbers of heater and cooler zones 108, 110 and 114, 116. For example, the heater could be formed with a single heater zone and the cooler could be formed with multiple cooler zones. In the absence of a heater, the cooler could still be formed with multiple cooler zones to provide for differentially cooling different portions of the substrate.

Instead of moving the cooler with respect to the pedestal, the cooler could be embedded in the pedestal and the heater could be made similarly movable with respect to the pedestal. Alternatively, a movable heater could be used without a cooler in the pedestal, or both the heater and the cooler could be movable with respect to the pedestal.

We claim:

1. A thermal-cycle chuck for processing substrates in a low-pressure environment comprising:
    a temperature conditioner including one of a heating unit and a cooling unit;
    a thermally conductive pedestal for supporting at least one of the substrates for processing in the low-pressure environment;
    said pedestal being sealed for separating said temperature conditioner from the low-pressure processing environment; and
    at least one actuator that moves said temperature conditioner with respect to said thermally conductive pedestal between a first position in enhanced thermal contact with said thermally conductive pedestal and a second position in reduced thermal contact with said thermally conductive pedestal for influencing rates of heat transfer between said temperature conditioner and said thermally conductive pedestal.

2. The chuck of claim 1 in which said temperature conditioner is exposed to atmospheric pressure conditions outside the low-pressure environment.

3. The chuck of claim 1 in which said temperature conditioner includes a cooling unit.

4. The chuck of claim 3 in which said thermally conductive pedestal incorporates a heating unit for raising the substrate temperature.

5. The chuck of claim 4 in which said at least one actuator moves said cooling unit of the temperature conditioner into enhanced thermal contact with said heating unit for more rapidly withdrawing heat from the thermally conductive pedestal.

6. The chuck of claim 3 in which said cooling unit includes conduits that circulate coolant through said cooling unit for cooling said temperature conditioner.

7. The chuck of claim 1 in which said at least one actuator moves said temperature conditioner into direct contact with said thermally conductive pedestal at said first position.

8. The chuck of claim 7 further comprising a fixed stop for limiting a distance between the temperature conditioner and the thermally conductive pedestal at said second position.

9. The chuck of claim 1 in which said at least one actuator translates said temperature conditioner along an axis between said first and second positions.

10. The chuck of claim 9 in which said at least one actuator is a pneumatic actuator.

11. The chuck of claim 1 in which said temperature conditioner includes a plurality of independently movable zones.

12. The chuck of claim 11 in which said at least one actuator includes a plurality of actuators for separately moving said independently movable zones of the temperature conditioner between the first and second positions.

13. A low-pressure processing system comprising:
    an evacuatable chamber for processing a substrate within a low-pressure processing environment;
    a chuck having a thermally conductive pedestal for supporting the substrate for processing within the low-pressure processing environment;
    a movable temperature conditioner located outside the low-pressure processing environment, said pedestal being sealed to said chuck between said evacuatable chamber and said temperature conditioner; and
    an actuator that moves said temperature conditioner with respect to said pedestal for regulating heat transfers between the substrate and said temperature conditioner.

14. The system of claim 13 in which said temperature conditioner is a cooler block.

15. The system of claim 14 in which said temperature conditioner is made from a thermally conductive material and has an interface area with said pedestal sized to support transfers of heat that cool the pedestal at a rate of at least 50 degrees centigrade per minute.

16. The system of claim 15 in which said interface area between the temperature conditioner and the pedestal is sized to support transfers of heat that cool the pedestal at a rate of at least 100 degrees centigrade per minute.

17. The system of claim 15 in which said temperature conditioner and said pedestal have irregular mating surfaces for increasing said interface area to enhance heat transfers.

18. The system of claim 14 in which said temperature conditioner includes a system for enhancing a withdrawal of heat from the temperature conditioner.

19. The system of claim 18 in which said system for enhancing withdrawal of heat includes conduits for circulating coolant through said temperature conditioner.

20. The system of claim 13 in which said actuator moves said temperature conditioner between a first position in enhanced thermal contact with said pedestal and a second position in reduced thermal contact with said pedestal.

21. The system of claim 20 in which said temperature conditioner is in direct physical contact with said pedestal at the first position and is out of direct physical contact with said pedestal at the second position.

22. The system of claim 20 in which said actuator translates said temperature conditioner along an axis between the first and second positions.

23. The system of claim 13 further comprising a heating unit in thermal contact with said pedestal for delivering heat to the pedestal.

24. The system of claim 23 in which said temperature conditioner is movable with respect to said pedestal for removing heat from the heating unit.

25. The system of claim 24 further comprising a controller that regulates said heating unit and said actuator for raising and lowering the substrate temperature.

26. The system of claim 13 in which an interface between said temperature conditioner and said pedestal is exposed to atmospheric pressure.

27. The system of claim 13 in which said movable temperature conditioner includes a plurality of independently movable zones.

28. The system of claim 27 in which said actuator moves each of said independently movable zones of the temperature conditioner with respect to said pedestal for regulating heat transfers between different portions of the substrate and said temperature conditioner.

29. A thermal-cycling chuck comprising:
a thermally conductive pedestal for supporting a substrate for processing within a low-pressure environment;
a temperature conditioner that is movable with respect to said pedestal;
said pedestal being sealed for separating the temperature conditioner from the low-pressure environment; and
a controller operatively connected to the temperature conditioner for regulating the temperature of the substrate by moving the temperature conditioner with respect to the pedestal between positions that change rates of heat transfer between the temperature conditioner and the pedestal.

30. The chuck of claim 29 in which the temperature conditioner includes at least one cooler block that is movable under control of the controller between a first position in enhanced thermal contact with the pedestal and a second position in reduced thermal contact with the pedestal.

31. The chuck of claim 30 further including a heater in thermal contact with the pedestal for raising the substrate temperature.

32. The chuck of claim 31 in which the at least one cooler block includes a plurality of cooler blocks for separately cooling different portions of the pedestal.

33. The chuck of claim 32 in which the plurality of cooler blocks are arranged concentrically to provide control over thermal gradients in the pedestal.

34. The chuck of claim 33 in which the heater includes a plurality of separately controlled heating zones.

35. The chuck of claim 33 in which the plurality of heating zones are arranged concentrically in radial positions aligned with the plurality of cooler blocks.

36. The chuck of claim 31 in which the controller cools the substrate by deactivating the heater and by moving the at least one cooler block into the first position of enhanced thermal contact with the pedestal.

37. The chuck of claim 31 in which the controller moves the at least one cooler block into and out of direct contact with the heater.

38. The chuck of claim 30 in which the cooler block is made of a thermally conductive material and has an interface area with the pedestal sized to support transfers of heat from the pedestal at a rate of at least 50 degrees centigrade per minute.

39. The chuck of claim 38 in which the interface area between the cooler block and the pedestal is sized to support transfers of heat from the pedestal at a rate of at least 100 degrees centigrade per minute.

40. The chuck of claim 30 in which conduits convey coolant through the at least one cooler block.

41. A method for cooling a substrate in a low-pressure processing environment comprising the steps of:
locating a cooler block outside the low-pressure processing environment;
positioning a substrate on a pedestal for processing within the low-pressure processing environment;
relatively moving the cooler block with respect to the pedestal into engagement with the pedestal;
cooling the pedestal and the substrate using the cooler block engaged with the pedestal; and
relatively moving the cooler block with respect to the pedestal into disengagement from the pedestal when the substrate has been sufficiently cooled.

42. The method of claim 41 including the step of maintaining a separation between the pedestal and the cooler block when the cooler block is disengaged from the pedestal.

43. The method of claim 42 including the further step of actively cooling the cooler block while the cooler block is disengaged from the pedestal in preparation for re-engaging the cooler block.

44. The method of claim 41 in which said step of maintaining a separation includes maintaining a fixed distance between the cooler block and the pedestal so that the cooler block only needs to travel a minimal distance to re-engage the pedestal.

45. The method of claim 41 in which the cooler block is made from a thermally conductive material and has an interface area with the pedestal sized to support transfers of heat from the pedestal at a rate of at least 50 degrees centigrade per minute.

46. The method of claim 41 including the step of using an actuator to engage the cooler block with the pedestal.

47. The method of claim 41 including the step of exposing the cooler block to atmospheric pressure at an interface between the pedestal and the cooler block to enhance thermal conduction between the cooler block and the pedestal.

48. The method of claim 47 including the step of exposing the cooler block to ambient temperature.

49. A method of heating and cooling a substrate in a low-pressure processing environment comprising the steps of:
positioning a substrate on a thermally conductive pedestal for processing within the low-pressure processing environment;

locating a heater in thermal contact with the thermally conductive pedestal;

activating the heater so that heat is transferred from the heater to the pedestal for raising substrate temperature;

locating a cooler outside the low-pressure processing environment; and relatively moving the cooler with respect to the pedestal into engagement with the pedestal outside the low-pressure processing environment so that heat is transferred from the pedestal to the cooler for at least limiting the rise in substrate temperature.

50. The method of claim 49 in which said step of relatively moving includes moving the cooler into contact with the heater for removing heat from the pedestal.

51. The method of claim 50 including the step of conveying coolant to and from the cooler so that heat is transferred from the heater to the cooler.

52. The method of claim 49 including the step of exposing an interface between the heater and cooler to atmospheric pressure.

53. The method of claim 49 including the step of deactivating the heater upon engagement of the cooler for lowering the substrate temperature.

54. The method of claim 49 including the further step of relatively moving the cooler with respect to the pedestal out of engagement with the pedestal to interrupt the transfer of heat from the pedestal to the cooler.

55. The method of claim 54 including the further step of actively cooling the cooler while the cooler is out of engagement with the pedestal.

56. The method of claim 55 including the further step of adjusting the relative position of the cooler with respect to the pedestal to further influence rates of heat transfer between the pedestal and the cooler.

57. A method of regulating the temperature of a substrate temperature in a low-pressure processing environment comprising the steps of:

mounting the substrate on a thermally conductive pedestal within the low-pressure processing environment;

locating a temperature conditioner within a chuck outside the low-pressure processing environment;

using the pedestal and the chuck to isolate the temperature conditioner from the low-pressure processing environment; and moving the temperature conditioner with respect to the thermally conductive pedestal between a first position in enhanced thermal contact with the thermally conductive pedestal and a second position in reduced thermal contact with the thermally conductive pedestal for influencing rates of heat transfer between the temperature conditioner and the thermally conductive pedestal.

58. The method of claim 57 including the further step of using the temperature conditioner to actively cool the thermally conductive pedestal in the first position of enhanced thermal contact.

59. The method of claim 58 in which said step of using the temperature conditioner includes conveying coolant to and from the temperature conditioner so that heat is transferred from the heater to the cooler.

60. The method of claim 57 including the step of exposing an interface between the temperature conditioner and the pedestal to atmospheric pressure.

61. The method of claim 57 in which said step of moving includes translating the temperature conditioner along an axis between the first and second positions.

62. The method of claim 57 including the further step of activating the temperature conditioner in the second position of reduced thermal contact with the pedestal to change a temperature of the temperature conditioner with respect to the pedestal.

63. A method performed by a low-pressure processing system including an evacuatable chamber for processing a substrate within a low-pressure processing environment, a chuck having a pedestal for supporting the substrate for processing within the low-pressure processing environment, a movable temperature conditioner located outside the low-pressure processing environment, and an actuator that moves the temperature conditioner with respect to the pedestal for regulating heat transfers between the substrate and the temperature conditioner and comprising the steps of:

mounting the substrate on the pedestal within the low-pressure processing environment;

locating the temperature conditioner outside the low-pressure processing environment; and moving the temperature conditioner with respect to the pedestal between a first position in enhanced thermal contact with the pedestal and a second position in reduced thermal contact with the pedestal for influencing rates of heat transfer between the temperature conditioner and the pedestal.

* * * * *